United States Patent
Kumar et al.

(10) Patent No.: US 7,256,636 B2
(45) Date of Patent: Aug. 14, 2007

(54) VOLTAGE CONTROLLED DELAY LINE (VCDL) HAVING EMBEDDED MULTIPLEXER AND INTERPOLATION FUNCTIONS

(75) Inventors: Rohit Kumar, San Jose, CA (US); Anand Daga, San Jose, CA (US); Sanjay Sethi, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/240,231

(22) Filed: Sep. 30, 2005

(65) Prior Publication Data
US 2007/0075757 A1  Apr. 5, 2007

Related U.S. Application Data

(60) Provisional application No. 60/718,014, filed on Sep. 16, 2005.

(51) Int. Cl.
*H03H 11/26* (2006.01)
(52) U.S. Cl. .................................. 327/277; 327/271
(58) Field of Classification Search ............... None
See application file for complete search history.

(56) References Cited

U.S. PATENT DOCUMENTS

| | | | |
|---|---|---|---|
| 5,646,564 A | 7/1997 | Erickson et al. | 327/158 |
| 6,094,082 A * | 7/2000 | Gaudet | 327/270 |
| 6,417,713 B1 | 7/2002 | DeRyckere et al. | 327/271 |
| 6,504,408 B1 | 1/2003 | von Kaenel | 327/158 |
| 6,525,584 B2 * | 2/2003 | Seo et al. | 327/276 |
| 6,680,634 B1 | 1/2004 | Ruha et al. | 327/158 |
| 6,958,640 B2 * | 10/2005 | Lee et al. | 327/261 |
| 2003/0006817 A1 * | 1/2003 | Seo et al. | 327/276 |
| 2004/0164780 A1 * | 8/2004 | Owens et al. | 327/276 |

FOREIGN PATENT DOCUMENTS

| | | |
|---|---|---|
| EP | 0657796 | 6/1995 |
| EP | 1265247 | 12/2002 |
| FR | 2841405 | 12/2003 |

OTHER PUBLICATIONS

"A Semidigital Dual Delay-Locked Loop", Sidiropoulos, et al, *IEEE Journal of Solid-State Circuits*, vol. 32, No. 11, Nov. 1997.
"A Portable Digital DLL for High-Speed CMOS Interface Circuits", Garlepp, et al, *IEEE Journal of Solid-State Circuits*, vol. 34, No. 5, May 1999.
"Low-Jitter Process-Independent DLL and PLL Based on Self-Biased Techniques", Maneatis, *IEEE Journal of Solid-State Circuits*, vol. 31, No. 11, Nov. 1996.
International search report application No. PCT/US2006/032918 mailed Dec. 21, 2006.

* cited by examiner

*Primary Examiner*—Cassandra Cox
(74) *Attorney, Agent, or Firm*—Meyertons Hood Kivlin Kowert & Goetzel, P.C.; Erik A. Heter

(57) ABSTRACT

A voltage controlled delay line (VCDL). The VCDL includes one or more cells. Each of the one or more cells includes two or more inputs and an output. Each of the one or more cells is configured to provide a delay as well as an interpolation function and a multiplexer function. The VCDL may be used to provide delay in a delay locked loop (DLL).

34 Claims, 5 Drawing Sheets

VOLTAGE CONTROLLED DELAY LINE (VCDL) HAVING EMBEDDED MULTIPLEXER AND INTERPOLATION FUNCTIONS

This application claims priority to U.S. provisional application Ser. No. 60/718,014, entitled "Delay-Locked Loop", filed Sep. 16, 2005.

BACKGROUND OF THE INVENTION

1. Field of the Invention

This invention relates to electronic circuits, and more particularly, to delay locked loops (DLLs).

2. Description of the Related Art

Delay-locked loops (DLLs) are commonly used circuits in computers and other digital systems. DLLs may be used to provide an arbitrary delay that is compensated for process, voltage, and temperature (PVT) variations.

FIG. 1 illustrates one embodiment of a typical DLL. The DLL includes a phase detector coupled to receive a reference clock and configured to make a phase comparison between the reference clock and a feedback signal. The output of the phase detector is received by a digital filter which then filters the digital signal and conveys it to an up/down counter. The filtered signal received by the up/down counter represents a phase relationship between the reference clock signal and the feedback signal (wherein the goal of the feedback loop is to align the falling edge of the feedback clock with the rising edge of the reference clock), and thus may cause the up/down counter to count either up or down in order to obtain the desired phase relationship. The output of the up/down counter may be provided to a digital-to-analog converter (DAC), which is configured to generate and provide a control voltage based on the count provided by the counter. The control voltage is received by a voltage controlled delay line (VCDL) which is then configured to provide the desired delay indicated by the control voltage. The delay output is then provided through a multiplexer and a phase interpolator (PI) to a clock tree, from which a clock signal is conveyed. A second multiplexer/PI conveys the feedback signal to the phase detector.

The output provided by the VCDL to each multiplexer/PI is a delayed signal passed through one of several lines (representing outputs of delay elements in the VCDL) through the multiplexer (which selects the proper output) and the PI, which interpolates between two phase divisions. Thus, if the VCDL has 16 outputs (and thus the multiplexer is a 16:1 multiplexer) and the PI can interpolate between two phase divisions, the clock cycle of the reference clock can be divided up in to 32 equal parts.

While the embodiment shown in FIG. 1 may be acceptable in some circumstances, it may introduce a significant static error into the feedback signal (and throughout the DLL) between the phases of the clock signal. Furthermore, since the embodiment utilizes a separate multiplexer/PI for the feedback path and the output clock signal, mismatches between these two units may be unaccounted for. The static error and mismatches may be unacceptable for many applications, particularly in the light of increasing clock speeds in computers and other digital systems.

SUMMARY OF THE INVENTION

A voltage controlled delay line (VCDL) is disclosed. In one embodiment, the VCDL includes one or more cells. Each of the one or more cells includes two or more inputs and an output. Each of the one or more cells is configured to provide a delay as well as an interpolation function and a multiplexer function. The VCDL may be used to provide delay in a delay locked loop (DLL).

In one embodiment, each cell includes a selection circuit associated with each of the two or more inputs. The multiplexer function is realized for a given input when its associated selection circuit is activated, thereby operatively coupling the input to the output. When the selection circuits associated for two different inputs are activated, the output provided is an interpolation of the signals provided to each of the two different inputs. The cell also includes at least one load circuit. The amount of delay provided by each cell is based on the amount of current flowing through its load circuit(s), which is in turn based on a control voltage.

The VCDL includes a first plurality of cells and a second plurality of cells. The cells of the first and second pluralities are identical, and the first plurality of cells is coupled to the second plurality of cells. However, the multiplexer and interpolation functions are disabled for the first plurality of cells, but are enabled for the second plurality.

A DLL circuit may implement various embodiments of the VCDL. The DLL circuit may also include a digital control loop with a phase detector, a filter, a counter, and a digital-to-analog converter. The VCDL may receive the control voltage (used by the load circuits of each cell) from the DAC, and may also receive the reference clock signal. The clock signal output of the DLL may be provided by the VCDL, and this signal may also be provided as a feedback signal.

BRIEF DESCRIPTION OF THE DRAWINGS

Other aspects of the invention will become apparent upon reading the following detailed description and upon reference to the accompanying drawings in which.

Figure 1:
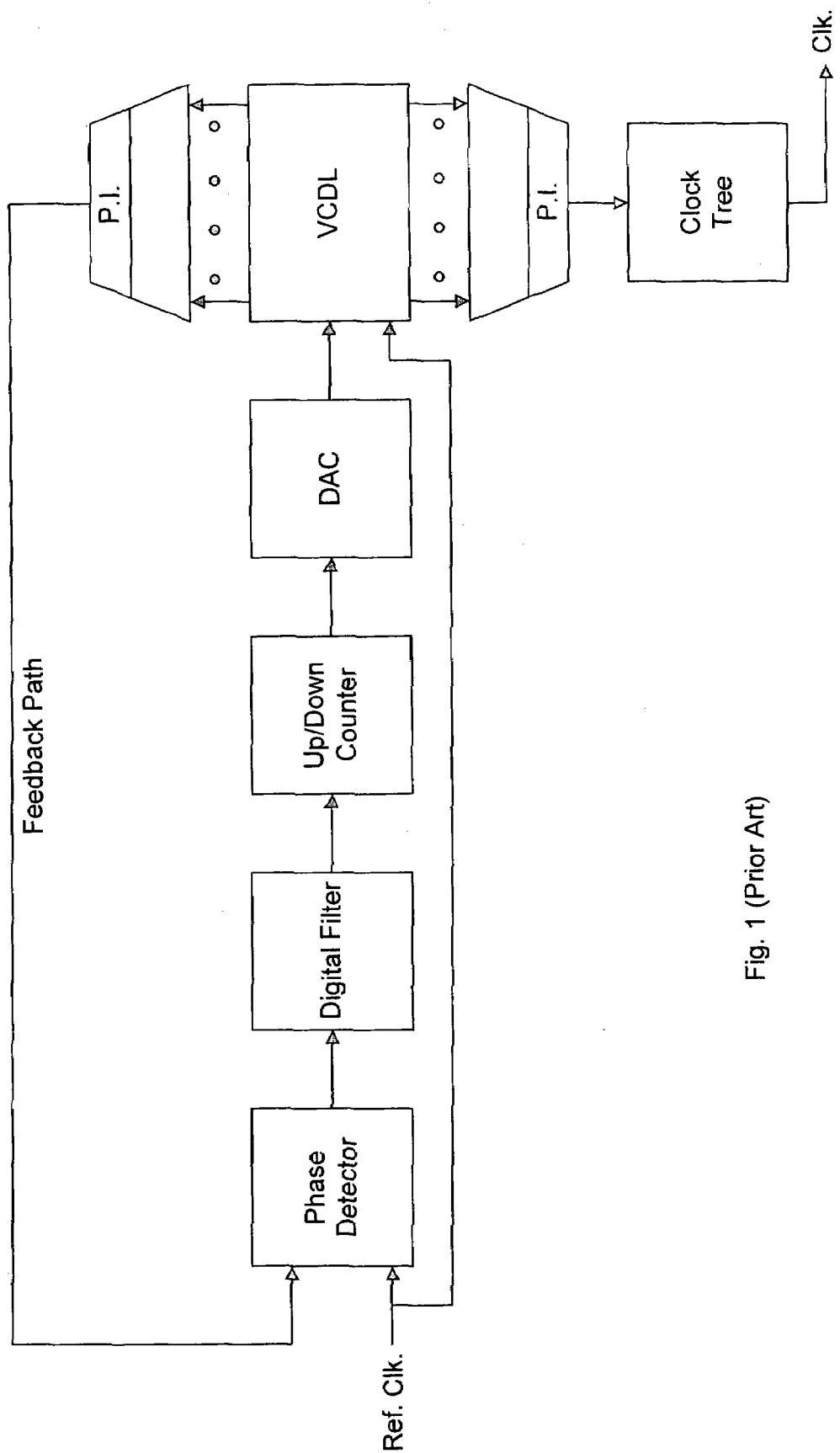
FIG. 1 (Prior Art) is a block diagram of one embodiment of a delay locked loop (DLL)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 2:
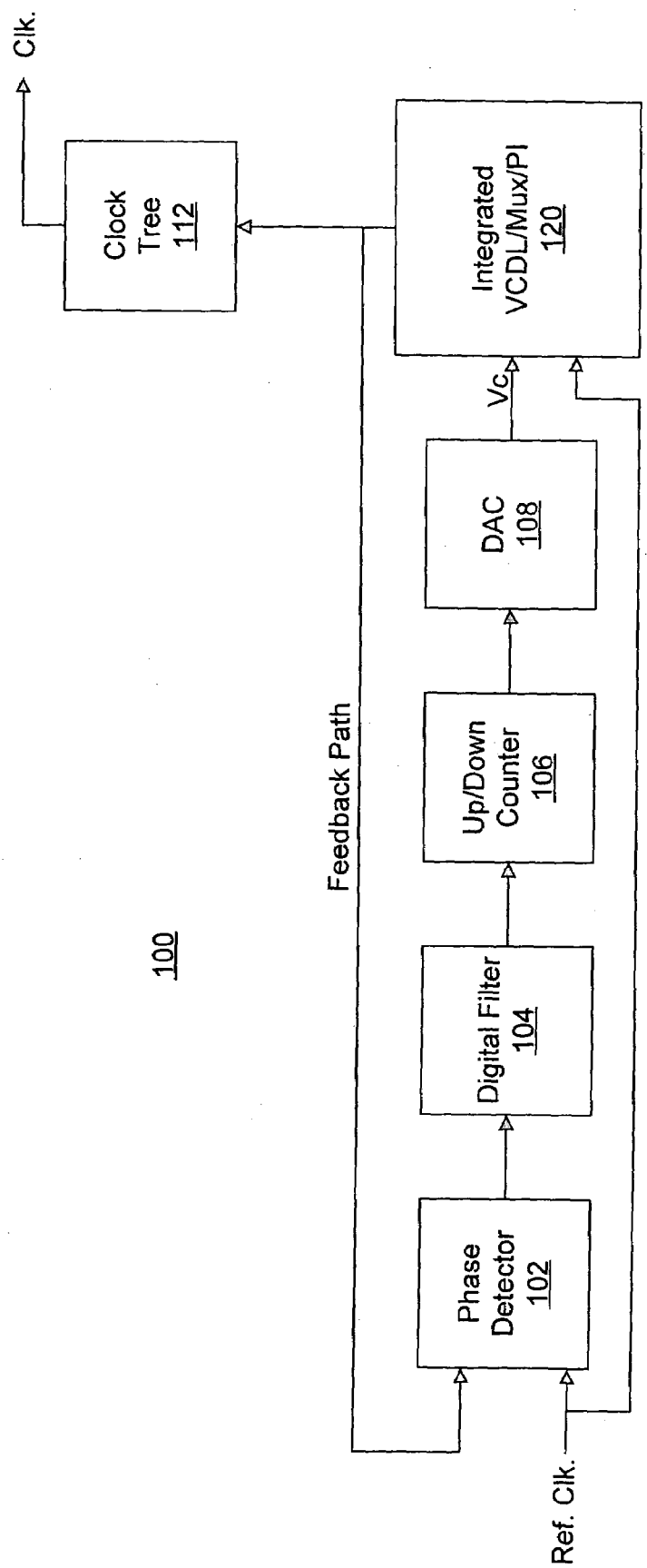
FIG. 2 is a block diagram of one embodiment of a DLL having a multiplexer and phase interpolation functions integrated into each cell of the voltage controlled delay line (VCDL)

Turning now to FIG. 2, a block diagram of one embodiment of a DLL having a multiplexer and phase interpolation functions integrated into each cell of the voltage controlled delay line (VCDL) is illustrated. In the embodiment shown, delay locked loop (DLL) 100 includes phase detector 102, which coupled to receive a reference clock signal. A voltage controlled delay line (VCDL) 120 is also coupled to receive the reference clock signal. In addition to receiving the reference clock signal, phase detector 102 is coupled to receive a feedback signal from VCDL 120. Phase detector 102 is configured to perform a phase comparison between the reference clock signal and the feedback clock signal. The result of the phase comparison is an error signal conveyed as an output by phase detector 102. It should be noted that in some embodiments, the reference clock and feedback signals may be differential signals, while in other embodiments these signals may be single ended signals. Similarly, the signals conveyed between the other units shown in FIG. 2 may also be either differential or single-ended signals.

Digital filter 104 is coupled to receive the error signal generated by phase detector 102. In one embodiment, digital filter 104 may be an infinite impulse response (IIR) filter, although embodiments using other filter types are possible and contemplated. Digital filter 104 used to remove high-frequency portions of the error signal output by phase detector 102, and thus may be implemented as a low-pass filter.

Up/Down (U/D) counter 106 is coupled to receive the filtered error signal provided by digital filter 104. U/D counter 106 may increment or decrement depending on the filtered error signal received from digital filter 104. The incrementing or decrementing of U/D counter 106 is dependent upon the phase relationship (as indicated by the error signal) between the reference clock signal and the feedback clock signal.

Digital-to-Analog converter (DAC) 108 is coupled to receive a counter value generated by U/D counter 106. In various embodiments, the counter output may be conveyed from U/D counter 106 to DAC 108 as a plurality of binary signals. Upon receiving the binary signals indicating the counter output, DAC 108 converts the count value into a control voltage value. This control voltage value may be a single voltage or may include multiple voltages for embodiments using differential signaling.

The control voltage(s) provided by DAC 108 is/are conveyed to voltage controlled delay line (VCDL) 120, which is also coupled to receive the reference clock signal. VCDL 120 includes a plurality of cells, and is configured to integrate multiplexer, delay, and interpolation functions. The output of VCDL 120 may be one of a number of different phase offset increments (with respect to the reference clock signal). In one embodiment, VCDL 120 may be configured to provide an output signal that is a phase offset of one of 32 different increments, wherein each increment of phase offset is 11.25 degrees (assuming that a locked VCDL 120 produces a total of 360 degrees of delay). Embodiments having a greater or lesser number of phase offset increments (and increment sizes) are possible and contemplated. VCDL 120 will be discussed in further detail below.

The output signal provided by VCDL 120 is provided both as a feedback signal along a feedback path (to phase detector 102) and to clock tree 112. Clock tree 112 distributes the clock signal provided by VCDL 120 to various circuits within the system in which it is implemented.

Figure 3:
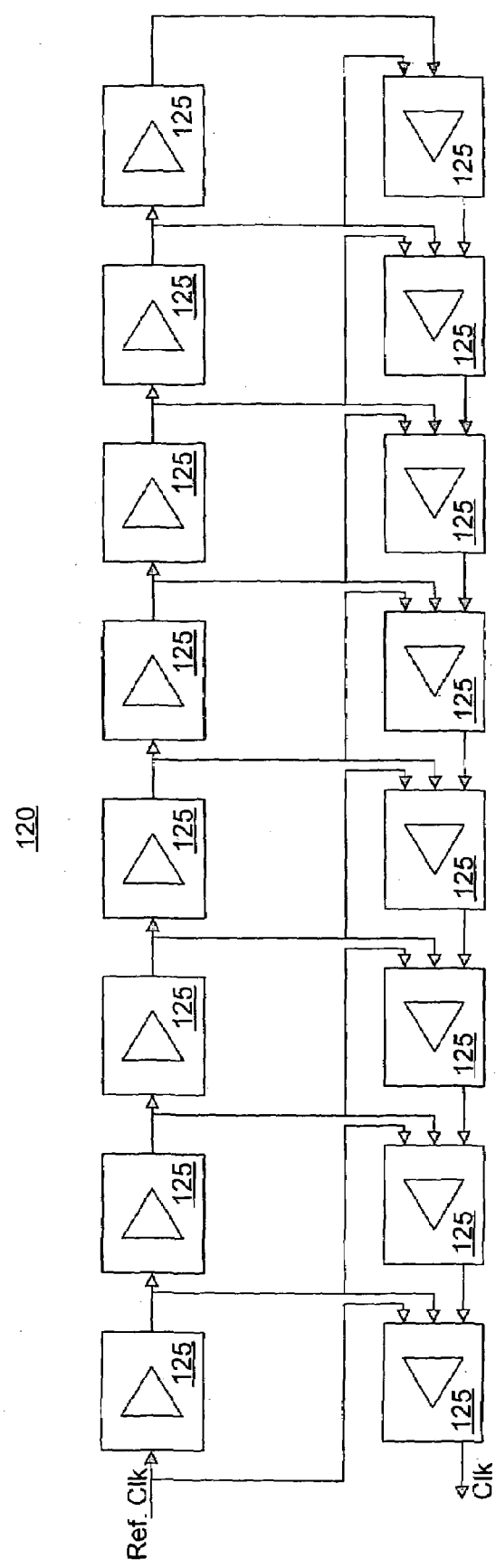
FIG. 3 is a block diagram of one embodiment of a VCDL used in the DLL of FIG. 2.

Moving now to FIG. 3, a block diagram of one embodiment of a VCDL used in the DLL of FIG. 2 is shown. In the embodiment shown, VCDL includes a plurality of cells 125. The cells 125 are divided into two groups as shown by the first (upper) row of cells and the second (lower) row of cells. A first cell 125 in the first group is coupled to receive a reference clock signal, while a last cell 125 in the second group is configured to provide an output clock signal that can be forwarded to a clock tree as well as to a phase detector (as a feedback signal).

Although the cells 125 in the first group are connected differently than those in the second group, it is important to note that those of the first group are identical to those in the second for the embodiment shown. Despite the fact that each of the inputs are not used for cells 125 in the first group, keeping the cells 125 of the first group identical to those of the second may result in fewer variations with matched cells. With fewer variations, the delay provided by each cell is thus more predictable and less prone to variations. Therefore, while none of the cells 125 of the first group utilize a multiplexer function or interpolator function, each of these cells is nevertheless so configured.

With one exception, each cell 125 in the second row is coupled to receive at least one of three different inputs. For each of the cells included in this subgroup, the inputs include the input node of its counterpart in the first group (i.e. directly above as shown in the drawing), the output node of its counterpart in the first group, and the output node of the immediately preceding cell 125. In contrast, each of the cells 125 in the first group receives an input only from the output node of the preceding cells, with the exception of the first cell 125 which receives the reference clock input. The first cell 125 of the second group (lower row, right side in the drawing) is coupled to receive inputs from each of the input and output nodes of the last cell 125 (upper row, right side in the drawing).

As previously noted, each cell 125 of VCDL 120 is configured to perform a multiplexer function. For each of the cells 125 coupled to receive multiple inputs, the multiplexer function may be implemented by selecting one of the inputs to be operatively coupled to the output. It should be noted that some embodiments, each cell is an inverter (which provides delay) and thus performs a logical inversion of the input signal. However, for the purposes of this disclosure, an input is considered to be operatively coupled to the output if it is a selected input, regardless of whether it is to be inverted or not inverted. It if further noted that embodiments are possible and contemplated wherein no inverter function is necessary or implemented in providing the delay. In those embodiments where an inverter function is used to implement a delay, the exact amount of delay provided may be controlled by controlling the inverter delay and/or the number of inverters in the chain.

In addition to performing a multiplexer function, each cell 125 is also configured to perform an interpolator function. For those cells 125 having multiple inputs, the interpolation function may be performed by selecting any two of the inputs to be operatively coupled to the output. Since the signals conveyed on the selected inputs are typically not in phase with each other, the combination of these two signals onto the same node will represent an interpolation of the two. It should be noted that in embodiments that include inverters, the signal resulting from interpolation is also inverted.

Figure 4:
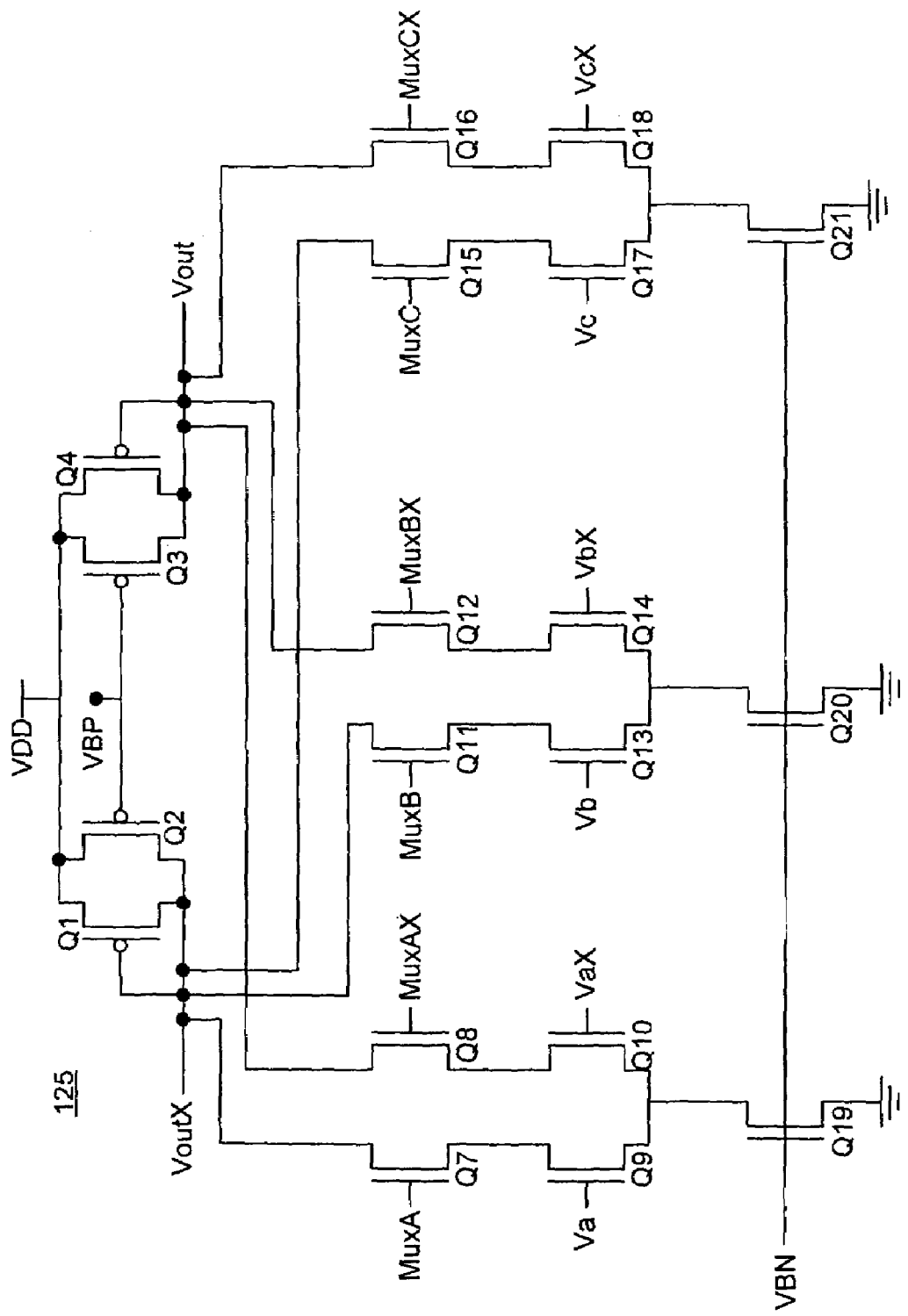
FIG. 4 is a schematic diagram of one embodiment of a cell used in the VCDL of FIG. 3.

FIG. 4 is a schematic diagram of one embodiment of a cell used in the VCDL of FIG. 3. In the embodiment shown, cell 125 is a differential circuit including multiple differential inputs and a differential output. Similar single ended embodiments are also possible and contemplated.

In this particular embodiment, cell 125 includes three differential inputs, Va, Vb, and Vc, along with their respective complementary differential inputs, VaX, VbX, and VcX. The signals to be received on each of these inputs is effectively a clock signal with a phase variation relative to the other inputs. Each cell 125 also includes three multiplexer select inputs, MuxA, MuxB, and MuxC (with complements). It should be noted that the multiplexer select inputs are not differential, but are in effect duplicate inputs to provide for both signals of their associated differential pair. Cell 125 also includes a differential output having complementary signal nodes Vout and VoutX. Each of inputs VaX, VbX, and VcX may be coupled to Vout when their associated multiplexer inputs are selected. Each of inputs Va, Vb, and Vc may be coupled to VoutX when their associated multiplexer inputs are selected. Thus, for this particular circuit configuration, an output signal associated with a given input signal is a logical inversion of the input signal, and thus an inverter function is implemented.

In the embodiment shown, cell 125 is coupled to receive control voltages VBP and VBN (which is generated from a replica circuit). These control voltages are typically generated by a DAC, such as DAC 108 as shown in FIG. 2. Each cell 125 includes a load circuit associated with each output node. A first load circuit includes transistors Q1 and Q2 each having a channel coupled between VDD and output node VoutX. A second load circuit includes transistors Q3 and Q4, each having a channel coupled between VDD and Vout. For the differential embodiment of FIG. 4, the second control voltage VBN is used control transistors Q19, Q20, and Q21 and thereby provide a pull-down path to ground (where the load circuits previously discussed provide a pull-up path to VDD).

Current through each selected leg of the circuit may be controlled based on the level of the control voltages, and thus the amount of current through the load circuits. In this particular circuit configuration, a larger value of VBP will result in a smaller value of $V_{GS}$ for each of PMOS transistors Q2 and Q3. This in turn will result in a smaller current value through the current path(s) enabled by the selected multiplexer inputs. Thus, the smaller current value will result in a slower switching time for Vout and VoutX, thereby increasing the delay provided by the cell. Conversely, a smaller value of VBP will result in a larger value of $V_{GS}$, a larger current value between VDD and ground, and thus faster switching times for Vout and VoutX, thereby decreasing the amount of delay provided by the cell. Thus, the delay of each cell 125 (and therefore the delay line as a whole) is controlled based on the received control voltage(s).

The multiplexer and interpolation functions are provided by each cell based on the state of the multiplexer selection inputs. For example, if the multiplexer inputs MuxA and MuxAX are selected, the differential clock signal received on inputs Va and VaX become operatively coupled to outputs VoutX and Vout, respectively. If only the inputs Va and VaX are to be selected, the MuxB and MuxC inputs are deselected. Inputs Vb and Vc can be selected to be operatively coupled in the same manner. Broadly speaking, the multiplexer function of cell 125 is implemented in a manner similar to that of a one-hot multiplexer. It is noted that discussions of the various signals above include a complementary signal for the embodiment shown, even where not explicitly mentioned.

The interpolation function of cell 125 is implemented by selecting two of the inputs. When two of the inputs are selected, current paths between VDD and ground exist through two different legs of the circuit (in contrast to only one for the multiplexer function). Thus, on each output node, Vout and VoutX, two signals of differing phases are combined. This combination of signals represents an interpolation between the two selected input signals. Table 1 below lists the various operational modes for the embodiment of cell 125 illustrated in FIG. 4.

TABLE 1

| Mux A | Mux B | Mux C | Vout | Comments |
|---|---|---|---|---|
| 0 | 0 | 1 | Vc | Vc operatively coupled to output |
| 0 | 1 | 0 | Vb | Vb operatively coupled to output |
| 1 | 0 | 0 | Va | Va operatively coupled to output |
| 0 | 1 | 1 | $(\omega b - \omega c)/2$ | Interpolate between Vb and Vc |
| 1 | 1 | 0 | $(\omega a - \omega b)/2$ | Interpolate between Va and Vb |
| 1 | 0 | 1 | $(\omega a - \omega c)/2$ | Interpolate between Va and Vc |
| 0 | 0 | 0 | X | Illegal |
| 1 | 1 | 1 | X | Illegal |

As can be seen from the above table, selecting any single input by way of selecting its multiplexer input thereby operatively couples the input to the output. Selecting any two inputs operatively couples both of them to the output and therefore interpolates between the inputs. Selecting all inputs or selecting none of the inputs are illegal operations.

Thus, as can be seen by Table 1 and the description above, each cell 125 integrates a multiplexer function, an interpolation function, and a delay function. By utilizing cells of this type, implementation of the multiplexer and interpolation functions external to the delay line and the resulting offsets that may occur can be avoided.

In some embodiments, a weighted interpolation function may be provided. A weighted interpolation function may allow for fine grain interpolation by adding weights to the two inputs being interpolated within. This may be accomplished by modulating the widths of transistors Q7, Q8, Q11, Q12, Q15, and Q16.

Figure 5:
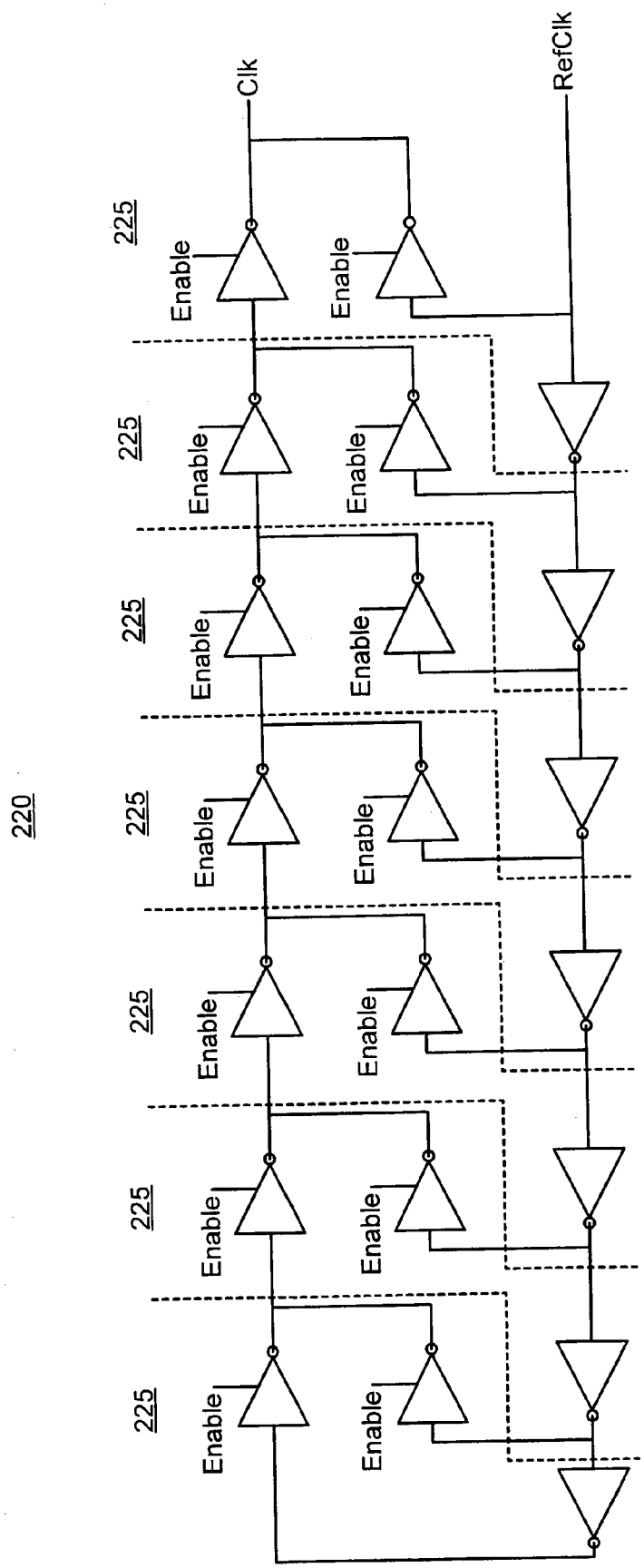
FIG. 5 is a diagram of one embodiment of a VCDL implementation utilizing single-ended signaling.

Turning now to FIG. 5, a diagram of one embodiment of a VCDL implementation utilizing single-ended signaling is shown. In the embodiment shown, VCDL 220 includes a plurality of cells 225, which are distinguished from each other using the dashed lines. The cells 225 in this embodiment are constructed using inverters. Similar to the differential embodiments discussed above, each of the inverters introduces delay into the signal path in which it is implemented.

Each cell 225 in the embodiment shown includes a plurality of inverters, including two inverters that may be selectively and independently enabled or disabled. A third inverter in each cell 225 of the embodiment shown is configured to remain enabled during operation of VCDL 225.

A multiplexer function may be realized for a given cell 225 by enabling one of the inverters configured therefor while disabling the other. Enabling one of the inverters while disabling the other effectively realized a one-hot multiplexer function for a given cell 225. An output signal conveyed from the enabled inverter's output is allowed to propagate to the next cell 225 (or, in the case of the last cell, to the output of VCDL 220).

An interpolation function may be realized for a given cell 225 by enabling both inverters that are configured for enabling/disabling. When both inverters so configured are enabled in a given cell 225, their respective outputs are connected to a common node. Thus, the resulting signal on this common node will represent an interpolation between the individual signals provided by each of the enabled inverters. These signals will typically have a phase difference with respect to each other due to the different delays resulting from a different number of inverters in their respective signal paths. Thus, the resultant signal on the common node will be an interpolation of the output signals provided by both of the inverters having an output connected thereto.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A voltage controlled delay line (VCDL) comprising:
a plurality of cells, wherein each of the plurality of cells includes two or more inputs and an output, and wherein each of the plurality of cells is configured to provide a delay, and is further configured to operate in one of a first mode providing an interpolation function or a second mode providing a multiplexer function;
wherein, when providing the multiplexer function, one of the two or more inputs is selected such that it is operatively coupled to the output;
wherein, when providing the interpolation function, two of the two or more inputs are selected such that each of the selected two inputs is operatively coupled to the output; and
wherein the VCDL further includes two or more selection circuits, wherein each of the two or more selection circuits is associated with a corresponding one of the two or more inputs, and wherein each selection circuit is configured to, when enabled, operatively couples its corresponding input to the output.

2. The VCDL as recited in claim 1, wherein each of the two or more selection circuits, when not enabled, inhibits its corresponding input from being conveyed to the output.

3. The VCDL as recited in claim 1, wherein the each of the plurality of cells includes a first input, a second input, and a third input.

4. The VCDL as recited in claim 3, wherein the each cell is configured to interpolate between the first input and the second input by selecting the first and second inputs such each of the first and second inputs are operatively coupled to the output.

5. The VCDL as recited in claim 3, wherein the each cell is configured to interpolate between the second and third inputs by selecting the second and third inputs such that each of the second and third inputs are operatively coupled to the output.

6. The VCDL as recited in claim 3, wherein the cell is configured to interpolate between the first and third inputs by selecting the first and third inputs such that each of the first and third inputs are operatively coupled to the output.

7. The VCDL as recited in claim 1, wherein each of the plurality of cells includes one or more load circuits, and wherein an amount of delay provided by each of the plurality of cells is determined by an amount of current flowing through each of the one or more load circuits.

8. The VCDL as recited in claim 7, wherein each of the one or more the load circuits is coupled to receive a control voltage, and wherein the current flowing through each of the one or more load circuits is based on the control voltage.

9. The VCDL as recited in claim 1, wherein the VCDL includes a first plurality of cells and a second plurality of cells, wherein the multiplexer and interpolation functions are disabled for the first group of cells and are enabled for the second group of cells.

10. The VCDL as recited in claim 9, wherein only one of the two or more inputs is coupled to received an input signal for each of the first plurality of cells.

11. The VCDL as recited in claim 10, wherein an input of one of the first plurality of cells acts as a reference clock input, and wherein an output of one of the second plurality of cells acts as a clock output.

12. The VCDL as recited in claim 9, wherein the first plurality of cells is coupled to the second plurality of cells.

13. The VCDL as recited in claim 1, wherein each of the two or more inputs is a differential input and wherein the output is a differential output.

14. The VCDL as recited in claim 1, wherein each of the two or more inputs is a single ended input and wherein the output is a single ended output.

15. The VCDL as recited in claim 1, wherein the VCDL includes 16 cells.

16. The VCDL as recited in claim 15, wherein the VCDL is configured to provide one of 32 different increments of delay.

17. A delay locked loop (DLL) comprising:
a phase detector configured to receive a reference clock signal;
a filter coupled to receive an output from the phase detector;
a counter coupled to receive an output from the filter;
a digital-to-analog converter (DAC) coupled to receive an output from the counter; and
a voltage controlled delay line (VCDL) coupled to receive a control voltage from the DAC and the reference clock signal, wherein the VCDL includes a plurality of cells, wherein each of the plurality of cells includes two or more inputs and an output, and wherein each of the plurality of cells is configured to provide a delay, and is further configured to operate in one of a first mode providing an interpolation function or a second mode providing a multiplexer function;
wherein, when providing the multiplexer function, one of the two or more inputs is selected such that it is operatively coupled to the output;
wherein, when providing in the interpolation function, two of the two or more inputs are selected such that each of the selected two inputs is operatively coupled to the output;
wherein the VCDL further includes two or more selection circuits, wherein each of the two or more selection circuits is associated with a corresponding one of the two or more inputs, and wherein each selection circuit is configured to, when enabled, operatively couples its corresponding input to the output.

18. The DLL as recited in claim 17, wherein each of the two or more selection circuits, when not enabled, inhibits its corresponding input from being conveyed to the output.

19. The DLL as recited in claim 17 wherein each of the plurality of cells includes a first input, a second input, and a third input.

20. The DLL as recited in claim 19, wherein each of the plurality of cells is configured to interpolate between the first input and the second input by selecting the first and second inputs such each of the first and second inputs are operatively coupled to the output.

21. The DLL as recited in claim 19, wherein each of the plurality of cells is configured to interpolate between the second and third inputs by selecting the second and third inputs such that each of the second and third inputs are operatively coupled to the output.

22. The DLL as recited in claim 19, wherein each of the plurality of cells is configured to interpolate between the first and third inputs by selecting the first and third inputs such that each of the first and third inputs are operatively coupled to the output.

23. The DLL as recited in claim 17, wherein each of the plurality of cells includes one or more load circuits, and wherein an amount of delay provided by each cell is determined by an amount of current flowing through each of the one or more load circuits.

24. The DLL as recited in claim 23, wherein each of the one or more the load circuits is coupled to receive a control voltage from the DAC, and wherein the current flowing through each of the one or more load circuits, wherein the current flowing through each of the one or more load circuits is based on the control voltage.

25. The DLL as recited in claim 17, wherein the VCDL includes a first plurality of cells and a second plurality of cells, wherein the multiplexer and interpolation functions are disabled for the first group of cells and are enabled for the second group of cells.

26. The DLL as recited in claim 25, wherein only one of the two or more inputs is active in the first plurality of cells.

27. The DLL as recited in claim 26, wherein an input of one of the first plurality of cells acts as a reference clock input, and wherein an output of one of the second plurality of cells acts as a clock output.

28. The DLL as recited in claim 25, wherein the first plurality of cells is coupled to the second plurality of cells.

29. The DLL as recited in claim 17, wherein each of the two or more inputs of each of the plurality of cells is a differential input and wherein the output of each of the plurality of cells is a differential output.

30. The DLL as recited in claim 17, wherein each of the two or more inputs of each of the plurality of cells is a single ended input and wherein the output of each of the plurality of cells is a single ended output.

31. The DLL as recited in claim 17, wherein the VCDL includes 16 cells.

32. The DLL as recited in claim 31, wherein the VCDL is configured to provide one of 32 different increments of delay.

33. The DLL circuit as recited in claim 17, wherein one or more of the plurality of cells is configured to provide a weighted interpolation function, wherein widths of at least one input transistor of the one or more of the plurality of cells is modulated with respect to another input transistor of the one or more of the plurality of cells.

34. A cell circuit configured for use in a voltage controlled delay line, the cell circuit comprising:
 two or more input nodes; and
 an output node;
 wherein the cell circuit is configured to provide a delay to signals provided to each of the two or more input nodes;
 wherein the cell circuit is configured to function as a multiplexer in a first mode of operation by selecting one of the two or more input nodes to be operatively coupled to the output node, wherein a signal conveyed on the output node in the first mode is a delayed version of a signal conveyed on the selected one of the two or more input nodes; and
 wherein the cell circuit is configured to function as an interpolator in a second mode of operation by selecting two of the two or more input nodes to be operatively coupled to the output node, wherein in the signal conveyed on the output node in the second mode is a delayed interpolation between input signals provided to the selected two input nodes.

* * * * *